(12) United States Patent
Eid et al.

(10) Patent No.: US 11,222,856 B2
(45) Date of Patent: Jan. 11, 2022

(54) PACKAGE-INTEGRATED BISTABLE SWITCH FOR ELECTROSTATIC DISCHARGE (ESD) PROTECTION

(71) Applicant: Intel Corporation, Santa Clara, CA (US)

(72) Inventors: Feras Eid, Chandler, AZ (US); Veronica Aleman Strong, Hillsboro, OR (US); Aleksandar Aleksov, Chandler, AZ (US); Adel A. Elsherbini, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 16/721,603

(22) Filed: Dec. 19, 2019

(65) Prior Publication Data

US 2021/0193597 A1    Jun. 24, 2021

(51) Int. Cl.

| *H01L 23/60* | (2006.01) |
|---|---|
| *H01L 21/48* | (2006.01) |
| *H01L 49/00* | (2006.01) |
| *H01L 23/498* | (2006.01) |
| *H01H 61/01* | (2006.01) |
| *H01H 49/00* | (2006.01) |
| *H01H 61/00* | (2006.01) |
| *H01L 23/00* | (2006.01) |

(52) U.S. Cl.
CPC ............. *H01L 23/60* (2013.01); *H01H 49/00* (2013.01); *H01H 61/01* (2013.01); *H01L 21/4857* (2013.01); *H01L 23/49822* (2013.01); *H01L 23/49838* (2013.01); *H01H 2061/008* (2013.01); *H01H 2221/046* (2013.01); *H01H 2221/08* (2013.01); *H01H 2239/018* (2013.01); *H01L 23/49816* (2013.01); *H01L 24/16* (2013.01); *H01L 2224/16235* (2013.01)

(58) Field of Classification Search
CPC ................. H01L 23/60; H01L 21/4857; H01L 23/49822; H01L 23/49838; H01H 49/00; H01H 61/01
See application file for complete search history.

(56) References Cited

U.S. PATENT DOCUMENTS

| 2006/0085160 | A1* | 4/2006 | Ouchi | ............... | H01Q 1/38 |
|---|---|---|---|---|---|
| | | | | | 702/150 |
| 2006/0087388 | A1* | 4/2006 | Kawai | ............ | H01P 1/20381 |
| | | | | | 333/219 |
| 2011/0211289 | A1* | 9/2011 | Kosowsky | ......... | H05K 1/0259 |
| | | | | | 361/91.1 |
| 2012/0200377 | A1* | 8/2012 | Lee | ............... | H01H 49/00 |
| | | | | | 335/179 |
| 2013/0026021 | A1* | 1/2013 | Hori | .............. | H01H 57/00 |
| | | | | | 200/5 A |
| 2017/0288642 | A1* | 10/2017 | Eid | ............... | H03H 9/17 |

* cited by examiner

*Primary Examiner* — Michael Jung
(74) *Attorney, Agent, or Firm* — Patent Capital Group

(57) ABSTRACT

Embodiments may relate to a package substrate that includes a signal line and a ground line. The package substrate may further include a switch communicatively coupled with the ground line. The switch may have an open position where the switch is communicatively decoupled with the signal line, and a closed position where the switch is communicatively coupled with the signal line. Other embodiments may be described or claimed.

19 Claims, 11 Drawing Sheets

PACKAGE-INTEGRATED BISTABLE SWITCH FOR ELECTROSTATIC DISCHARGE (ESD) PROTECTION

BACKGROUND

One concern for microelectronic packages is electrostatic discharge (ESD). ESD may refer to a sudden onset of charge transfer (i.e., electron flow) between two objects with different electric potentials. These static voltages may cause partial to full breakdown of an integrated circuit (IC) of the microelectronic package.

DETAILED DESCRIPTION

Figure 1:
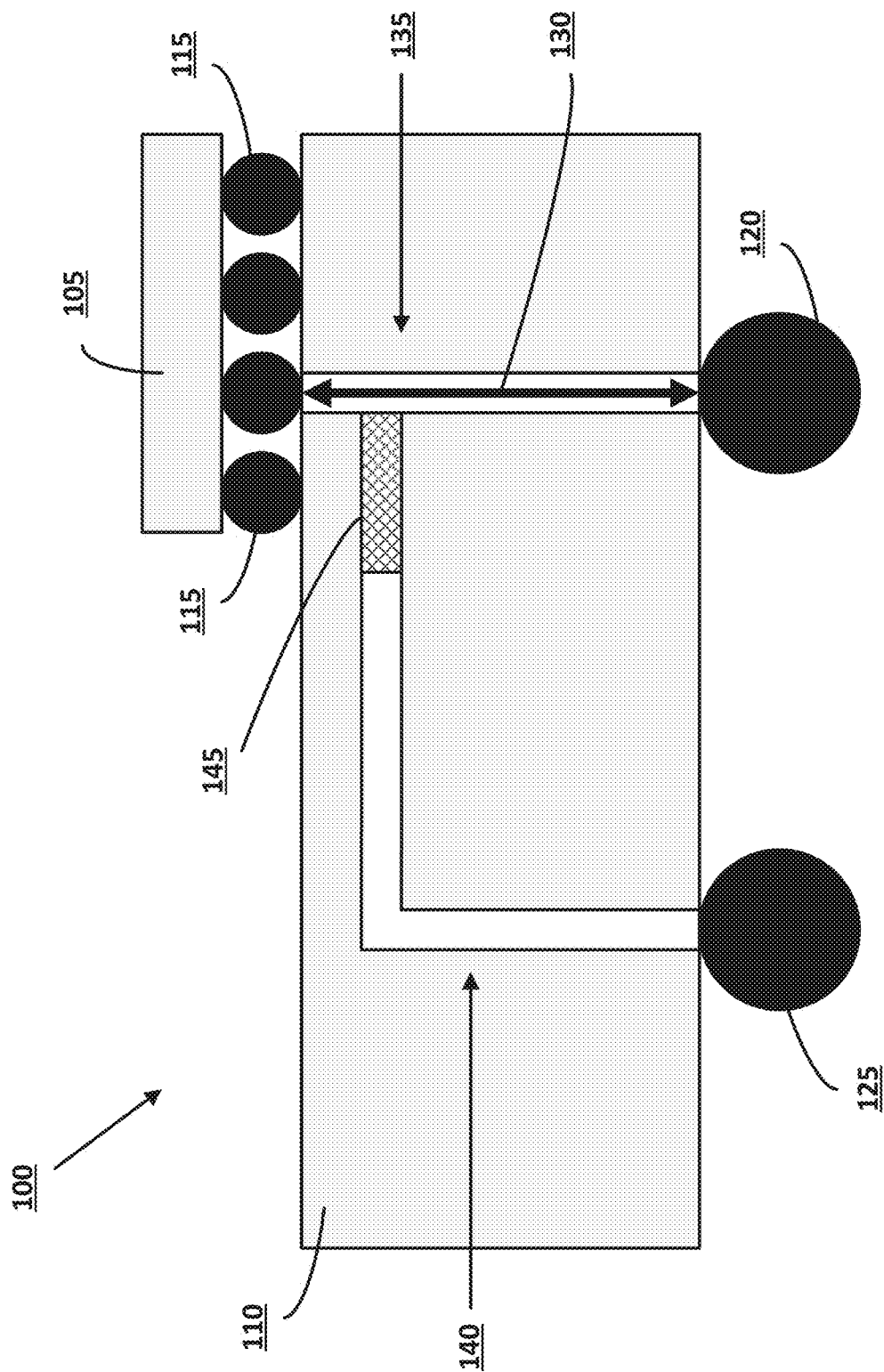
FIGS. 1 and 2 depict an example microelectronic package with an ESD protection structure with a bistable switch, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

It will be understood that the term "microelectronic package" may, in other situations, be referred to as a "semiconductor package." However, the term "microelectronic package" will be used herein for the sake of consistency.

As noted, ESD may be undesirable in a microelectronic package because it may cause partial to full breakdown of ICs of the microelectronic package, even when the ICs are only exposed to the static voltages for a relatively short period of time. Hence, ESD protection may be viewed as a reliability concern and an important element of any electronic system, especially when IC costs are considered.

Generally, innovation into ESD protection may be desired to keep up with the ongoing trend of shrinking IC sizes and the increased number of high-speed signal lines or higher operating frequencies. This trend may result in a desire for minimizing the IC area that is dedicated to ESD protection features on-die (such as on-die diodes). It may therefore be desirable to offload some of the ESD protection features from the die and integrate them in the package as an embedded package solution in next-generation packaging technologies.

Embodiments herein relate to integrating ESD protection features in the package substrate rather than an on-die feature as may be used in legacy microelectronic packages. The ESD protection features may include switches (which may be referred to as microelectromechanical system (MEMS) switches) that move between "on" or "off" positions to either connect or disconnect input/output (I/O)-carrying package features (e.g., traces or plated through holes) from ground, respectively. In some embodiments, the "on" position may be referred to as a "closed" configuration. The "off" position may be referred to as an "open" configuration. The I/O-carrying package features may be referred to as "signal lines." ESD protection may be enabled when the switch is closed, and disabled when the switch is open. When the switch is open, the microelectronic package may operate as normal, and when the switch is closed then the signal line may shunt to ground as will be described in further detail below.

Embodiments may provide a number of advantages. For example, embodiments may allow for a reduction in the number of on-die ESD diodes, and offloading of ESD protection features to the package substrate, thereby allowing a reduction in the real estate of the dies, and resulting in the ability to include more dies per wafer. Embodiments may allow a reduction in the capacitive loading and leakage power during normal chip operation (e.g., when the switch is open) compared to those caused by on-die diodes.

More generally, embodiments relate to integrating a switch such as a MEMS switch in the package substrate to provide ESD protection. The switch may be referred to as a "bistable" switch in that it may have two stable configurations (e.g., open or closed as described above). The switch may include metal traces in the substrate with the dielectric around those traces removed to create a cavity that allows the traces to move. The switch may be anchored to fixed locations (e.g., vias) in the substrate by means of tethers which provide bistability by allowing the switch to move between two positions upon excitation. The anchors (and, thus, the entire switch) may be electrically coupled to ground. When the switch is excited, it may move from one bistable position (e.g., open) to another (e.g., closed, or, vice-versa).

In the closed position, the switch may contact a set of signal lines, which may be used to transmit signals to a die or on-die devices such as ICs that are desired to be protected from an ESD event, thereby shunting the signal lines to ground. In this closed position, ESD protection may be enabled and any large voltages or electrostatic charges at the exposed signal lines (for example, which the microelectronic package may experience during assembly or handling) may be shunted to ground through the MEMS switch. In the open position, the switch may disconnect from the signal lines. In this position, ESD protection may be disabled, and the signals in the signal lines may be transmitted to the die for processing as desired during normal operation.

Figure 2:
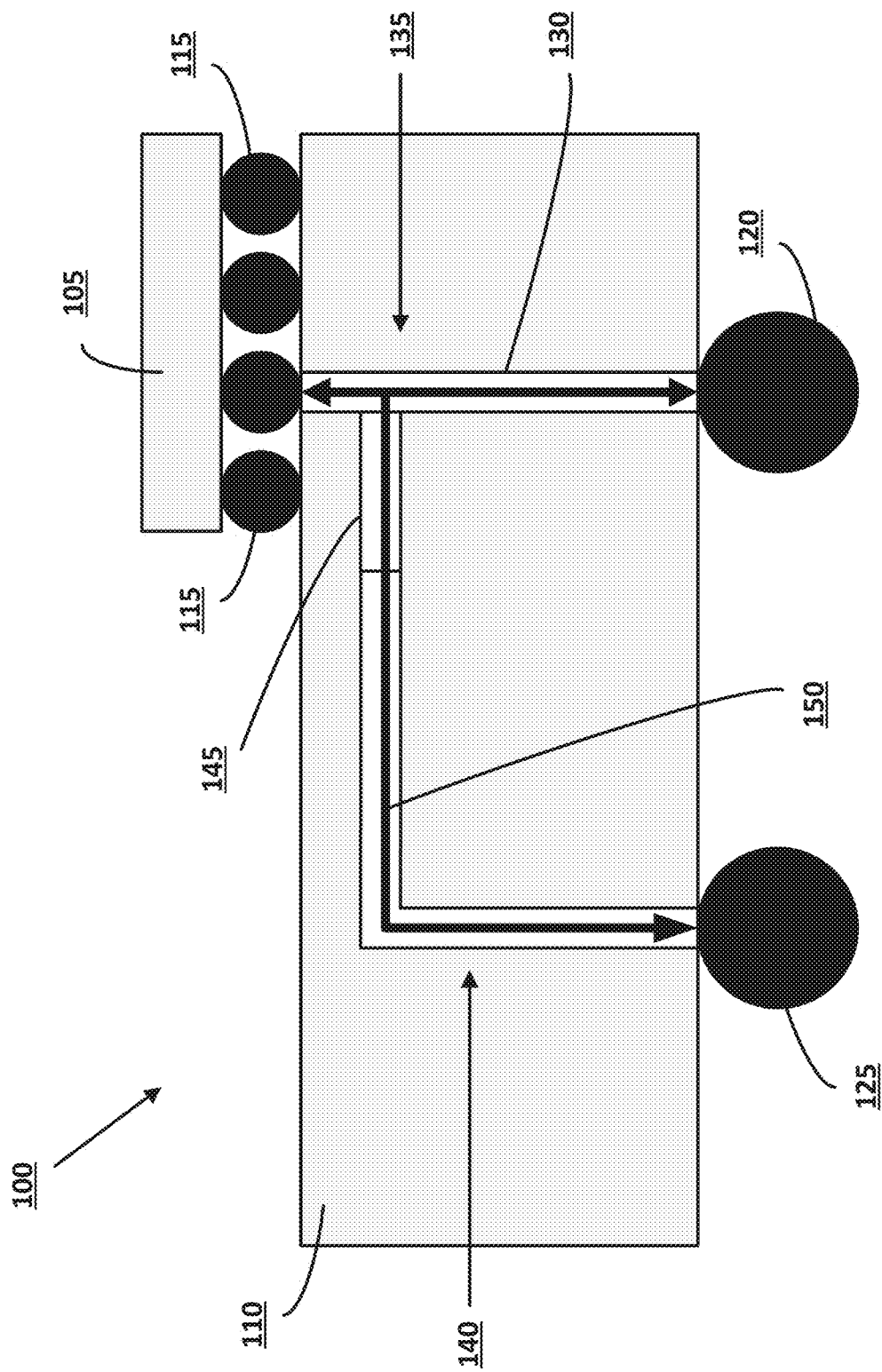

FIGS. 1 and 2 depict an example microelectronic package 100 with an ESD protection structure 145, in accordance with various embodiments. Generally, the package 100 may include a die 105 coupled with a package substrate 110. The die 105 may be or include, for example, a processor such as a central processing unit (CPU), general processing unit, a core of a distributed processor, or some other type of processor. Alternatively, the die 105 may be or include a memory such as a double data rate (DDR) memory, a nonvolatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the die 105.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate. It will be understood that although the package substrate 110 is discussed herein as an element of the microelectronic package 100, in other embodiments the package substrate 110 may be considered to be an element separate from the microelectronic package 100 to which the microelectronic package 100 is coupled.

The die 105 may be coupled with the package substrate 110 by one or more interconnects 115. The interconnects 115 may be, for example, C4 (controlled collapse chip), or flip-chip, bumps that are formed of a material such as tin, silver, copper, etc. Generally, the interconnects 115 may physically or communicatively couple the die 105 with the package substrate 110. For example, one or more of the interconnects 115 may physically couple with, and allow electrical signals to pass between, pads of the die 105 and pads of the package substrate 110 (not shown for the sake of elimination of clutter of FIGS. 1 and 2). In other embodiments, one or more of the interconnects 115 may physically couple the die 105 and the package substrate 110, but the interconnects 115 may not communicatively couple the die 105 and the package substrate 110.

The microelectronic package 100 may further include a plurality of interconnects such as interconnects 120 and 125. The interconnects 120 and 125 may be formed of a material such as tin, copper, silver, etc. Specifically, the interconnects 120/125 may be elements of a ball grid array (BGA), pin grid array (PGA), land grid array (LGA), etc. The interconnects 120/125 may communicatively or physically couple the microelectronic package 100 to another element of an electronic device such as a PCB, a motherboard, an interposer, etc.

More specifically, the interconnect 120 may communicatively couple the microelectronic package 100 with a voltage input. The voltage input may be, for example, a power source, a communicative pathway (e.g., a signal line or a power line), or some other element of an electronic device of which the microelectronic package 100 is a part. Specifically, the voltage input may provide an electrical signal 130 with an input voltage. The interconnect 125 may communicatively couple the microelectronic package 100 with a ground. The ground may be, for example, a ground plane of the electronic device or some other ground.

As noted above, the substrate 110 of the microelectronic package 100 may include a number of conductive elements such as vias, traces, microstrips, striplines, pads, etc. The conductive elements may form a number of signal/electronic pathways through the substrate 110. One such pathway is signal path 135. The signal path 135 may allow for the electrical signal 130 to travel between the interconnect 120 and the die 105. The electrical signal 130 may be, for example, a data signal, a power signal, or some other type of electrical signal.

The substrate 110 may further include a ground path 140. The ground path 140 may be coupled with the interconnect 125 and, through interconnect 125, to ground. In some embodiments, the ground path 140 may be referred to as a "shunt" to ground.

The ground path 140 and the signal path 135 may be communicatively coupled by an ESD protection structure 145. As can be seen, the ESD protection structure 145 may be communicatively located between the ground path 140 and the signal path 135.

The ESD protection structure 145 may include a bistable switch. FIG. 1 depicts an example embodiment in which the bistable switch may be "open" and so the ESD protection structure 145 may be electrically insulative. In this embodiment, the electrical signal 130 may traverse the signal path 135 between the interconnect 120 and the die 105. However, FIG. 2 depicts an example embodiment in which the bistable switch may be "closed," and so the ESD protection structure 145 may be electrically conductive. In this embodiment, the electrical signal 130 may traverse the signal path 135 between the interconnect 120 and the die 105. However, the electrical signal 130 may additionally shunt to ground by way of the ground path 140 to interconnect 125. In this manner, the ESD event may be mitigated by shunting at least a part of the excess voltage to the ground path 140 rather than delivering the full voltage (which may be at a harmful level) to the die 105.

It will be understood that the above-described FIGS. 1 and 2 are intended as examples, and other embodiments may vary with respect to number of elements, specific configurations, etc. For example, it will be understood that the signal path 135 and the ground path 140 are highly simplified examples, and other embodiments may include additional conductive elements such as pads, traces, etc. Similarly, the relative sizes, shapes, or number of the paths, the dies, the interconnects, etc. may be different in other embodiments. For example, some embodiments may have additional dies 105, additional interconnects 115/120/125, additional signal paths 135 or ground paths 140, additional ESD protection structures 145, etc., or one or more of those elements in a location that is different than the location depicted in FIG. 1 or 2. Other variations may be present in other embodiments.

Figure 3:
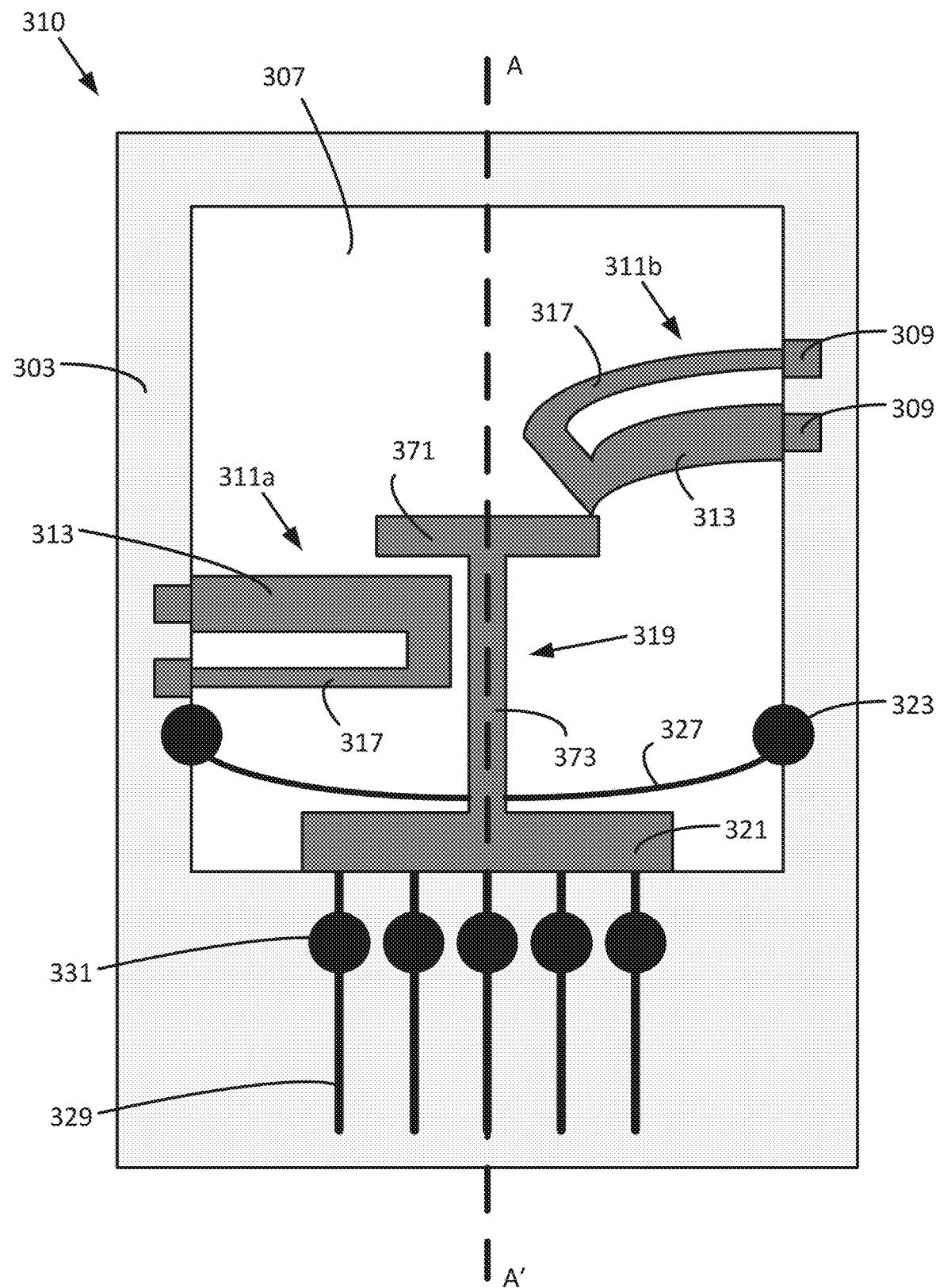
FIG. 3 depicts a simplified top-down view of a package substrate with an ESD protection structure that includes a bistable switch in a "closed" configuration, in accordance with various embodiments.
Figure 4:
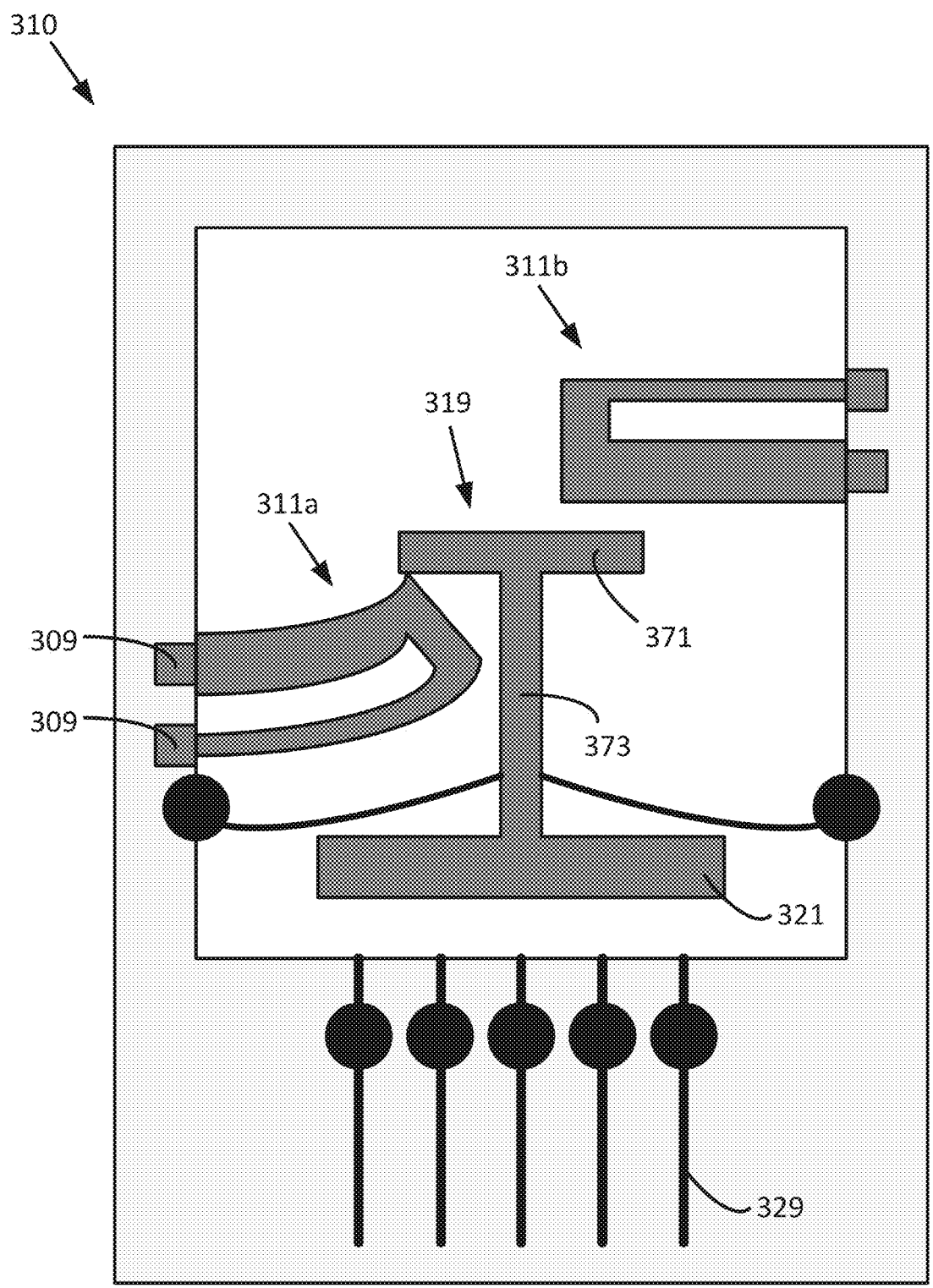
FIG. 4 depicts the package substrate of FIG. 3 with the bistable switch in an "open" configuration, in accordance with various embodiments.
Figure 5:
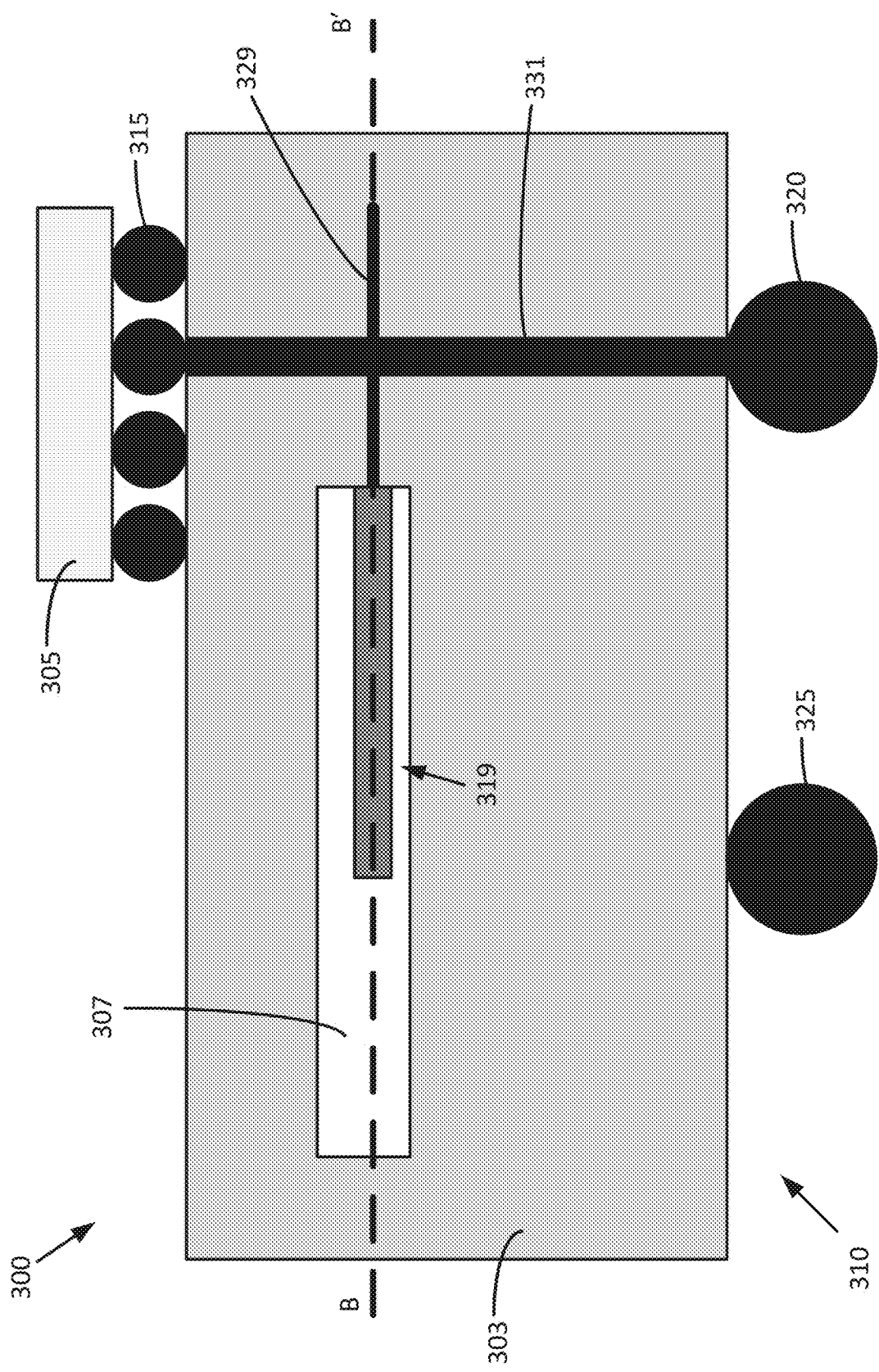
FIG. 5 depicts a simplified cross-sectional view of the package substrate of FIG. 3, in accordance with various embodiments.

FIGS. 3-5 depict an example package substrate 310 which may include a bistable switch 319 that may provide ESD mitigation. Specifically, FIG. 3 depicts a simplified top-down view of a package substrate 310 with an ESD protection structure that includes a bistable switch 319 in a "closed" configuration, in accordance with various embodiments. FIG. 4 depicts the package substrate 310 with the bistable switch 319 in an "open" configuration, in accordance with various embodiments. FIG. 5 depicts a simplified cross-sectional view of the package substrate 310, in accordance with various embodiments. Generally, FIG. 5 is a simplified cross-sectional view along line A-A' of FIG. 3. FIGS. 3 and 4 are a simplified top-down view along line B-B' of FIG. 5. In FIG. 5, a larger view of the overall microelectronic package 300 is depicted, which may include a die 305 and an interconnect 315 which may be respectively similar to, and share one or more characteristics with, die 105 and interconnect 115.

The package substrate 310 may be generally similar to, and share one or more characteristics with, package substrate 110. The package substrate 310 may be formed of an organic or inorganic substrate material 303 which may be a dielectric material such as a build-up film or some other material. The package substrate 310 may have a cavity 307 in a layer of the substrate material 303. Generally, the cavity 307 is depicted in FIGS. 3 and 4 as encompassing a majority of the layer of the package substrate 310 in which the cavity 307 is positioned. Additionally, the cavity 307 is depicted in FIG. 5 as having a height that is generally similar to the height of the layer of the package substrate 310 in which cavity 307 is positioned. However, it will be understood that this depiction is for the sake of clear depiction of various elements of the package substrate 310, and in other embodiments the cavity 307 may be smaller in one or more dimensions with respect to the overall size of the package substrate 310.

A bistable switch 319 may be positioned in the cavity 307. As described above, the bistable switch 319 may have two positions, an open position and a closed position. In FIGS. 3 and 5, the bistable switch 319 may be referred to as closed, as described above. In FIG. 4, the bistable switch 319 may be referred to as open, as described above. Generally, the bistable switch 319 may have an actuator plate 371 and a strike plate 321 as depicted in FIGS. 3 and 4. In some embodiments, the actuator plate 371 and the strike plate 321 may be generally separated from one another as depicted, and coupled by a connecting element 373; in other embodiments the actuator plate 371 and the strike plate 321 may be coupled together in some other manner.

The package substrate 310 may include one or more connections to ground such as ground vias 323. The ground vias 323 may be an element of a ground path such as ground path 140 described above. Specifically, the ground vias 323 may be coupled with ground through, for example, an interconnect 325 which may be similar to, and share one or more characteristics with, interconnect 125. Although the ground vias 323 are referred to as "vias" herein, in some embodiments the ground vias 323 may include one or more vias, pads, traces, or some other conductive element that provides a pathway to ground.

The ground vias 323 may be coupled with the switch 319 by ground couples 327. The ground couples 327 may be formed of a conductive material such as copper, gold, etc. In some embodiments the ground couples 327 may be a wire or some other flexible element. In some embodiments the ground couples 327 themselves may be configured to flex or bend when the switch 319 moves, while in other embodiments the ground couples 327 may be relatively stiff but coupled with the ground vias 323, the switch 319, or both by a flexible joint such as a hinge.

The package substrate 310 may further include one or more signal traces 329 which may be, for example, a trace, a microstrip, a stripline, or some other conductive element. The package substrate 310 may further include one or more signal vias 331. The signal vias 331 may be, for example, an element of a signal pathway such as signal path 135. Specifically, the signal vias 331 may be coupled with an interconnect such as interconnect 320, and also interconnect 315. Interconnect 320 may be similar to, and share one or more characteristics with, interconnect 120. Specifically, interconnect 320 may be configured to convey data signals between the microelectronic package 300 and another element of an electronic device of which the microelectronic package 300 is a part. The signal vias 331 may convey the data signal between the interconnect 320 and die 305 (by way of interconnects 315). It will be understood that although the signal vias 331 are depicted in FIG. 5 as a unitary vertical element with respect to the package substrate 310, in other embodiments the signal vias 331 may include a number of vias, traces, pads, microstrips, striplines, or other conductive elements. Generally, the elements marked as signal vias 331 in FIGS. 3 and 4 may, in real-world embodiments, be implemented as conductive pads that are coupled with inter-layer vias.

As noted above, the switch 319 may include a strike plate 321 which may be a conductive element (e.g., formed of a material such as copper, gold, etc.) that is configured to contact the signal trace(s) 329 when the switch 319 is in the closed position. As can be seen, the signal trace(s) 329 may be communicatively coupled with the signal via(s) 331 and so, when the switch 319 is in the closed position, the strike plate 321 may likewise be communicatively coupled with the signal vias 331 by way of the signal traces 329. Generally, the connecting element 373 may be or include one or more conductive elements such that the ground couples 327 are communicatively coupled with the strike plate 321. Therefore, in operation, when the switch 319 is in the closed position, the switch 319 (and particularly the connecting element 373 and the strike plate 321) may serve to communicatively couple the ground couple 327 with the signal trace(s) 329. As a result, the signal traces 329 may be communicatively coupled with the ground via 323 when the switch 319 is in the closed position. This may serve to shunt the signal path to ground as described above.

The package substrate 310 may further include two actuators. The actuators may include a coupling actuator 311b and a decoupling actuator 311a (collectively referred to as "actuators 311"). The actuators 311 may be referred to as "electromechanical actuators." Each of the actuators 311 may include a thick arm 313 and a thin arm 317 as depicted in FIGS. 3 and 4. The respective arms 313 and 317 may be coupled with a contact 309. When a current is applied to one of the actuators 311 by way of the contact 309, the actuator may bend towards the thick arm 313 because the arms 313 and 317 may heat up to different degrees. It will be understood that the coupling actuator 311b is depicted in FIG. 3 as having a current applied to it. Similarly, the decoupling actuator 311a is depicted in FIG. 4 as having a current applied to it. The neutral position (e.g., the position in which the actuator may be if no current is being applied) may be as depicted for decoupling actuator 311a in FIG. 3 and for coupling actuator 311b in FIG. 4.

As can be seen in FIG. 3, the thick arm 313 of the coupling actuator 311b may be on the side of the coupling actuator 311b that is closer to the signal traces 329. In this situation, application of a current to the coupling actuator 311b may cause the coupling actuator 311b to bend towards the signal traces 329. The bending of the coupling actuator 311b may cause the coupling actuator 311b to strike the actuator plate 371 and thereby push the switch 319 into a closed position as depicted in FIG. 3.

Similarly, as can be seen in FIG. 4, the thick arm 313 of the decoupling actuator 311a may be on the side of the decoupling actuator 311a that is further from the signal traces 329. In this situation, application of a current to the decoupling actuator 311a may cause the decoupling actuator 311a to bend away from the signal traces 329. The bending of the decoupling actuator 311a may cause the decoupling actuator 311a to strike the actuator plate 371 and thereby push the switch 319 into an open position as depicted in FIG. 4.

It will be understood that the actuator plate 371 may be an element of the switch 319, for example coupled to the strike plate 321 by way of connecting element 373. However, the actuator plate 371 may be formed of, or include, an insulative material such as a plastic or some other material. Therefore, current applied to the actuators 311 by way of contacts 309 may not be transferred to the signal traces 329 by the switch 319. However, in other embodiments the switch 319 may be a unitary element that is formed of a single material.

As noted above, in operation the package substrate 310 may provide for selective protection against ESD events which may be harmful to the die 305 of the microelectronic package 300. Specifically, if the microelectronic package 300 will be in an environment where an ESD event is likely (e.g., shipping or manufacturing), then the coupling actuator 311b may be activated to close the switch 319 prior to the microelectronic package 300 entering that environment. Therefore, if an ESD event occurs, then the excess voltage may be shunted to ground. When the microelectronic package 300 exits that environment, then the decoupling actuator 311a may be activated to open the switch 319 so that signals may freely pass to or from the die 305 without being shunted to ground.

Generally, it will be understood that the embodiment of FIGS. 3-5 is intended as an example embodiment and other embodiments may vary. For example, the microelectronic package may include more or fewer elements than are depicted. Specifically, additional active or inactive elements such as capacitors, resistors, etc. may be present in various of the signal or ground paths, within the cavity 307, etc. In some embodiments, more or fewer dies, interconnects, signal traces, signal vias, switches, etc. may be present. In some embodiments, a different type of actuator (e.g., a piezo actuator or some other type of actuator) may be used in place of, or in addition to, the depicted electromechanical actuators. In some embodiments, the relative dimensions of various elements along one or more axes may be different than depicted. For example, the relative thickness of the thick arm 313 and the thin arm 317 may be different in other embodiments. In some embodiments the specific shapes of various elements such as the actuators, the switches, the various vias or traces, etc. may be different in other embodiments. Other variations may be present in other embodiments.

Figure 6:
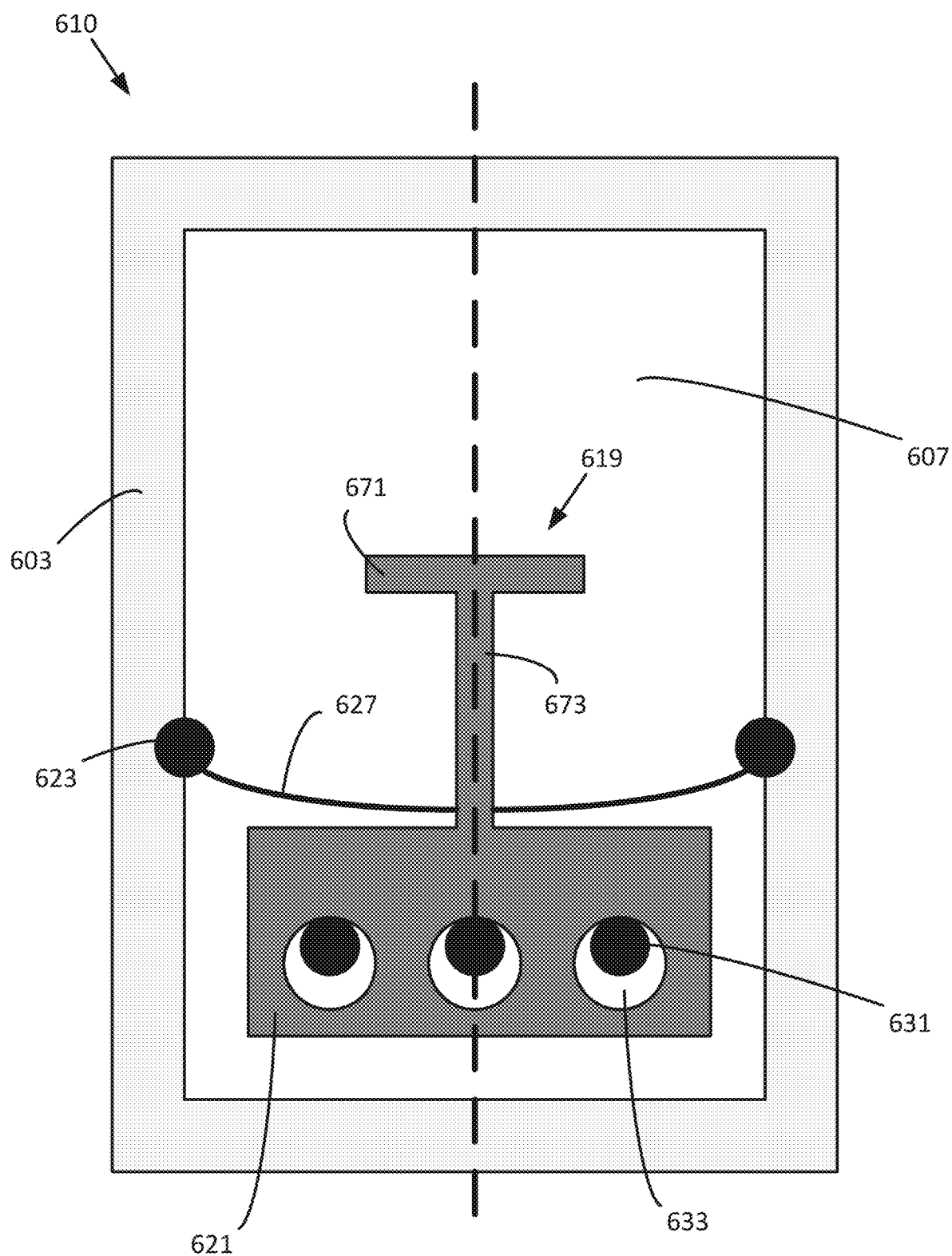
FIG. 6 depicts a simplified top-down view of an alternative package substrate with an ESD protection structure that includes a bistable switch in a "closed" configuration, in accordance with various embodiments.
Figure 7:
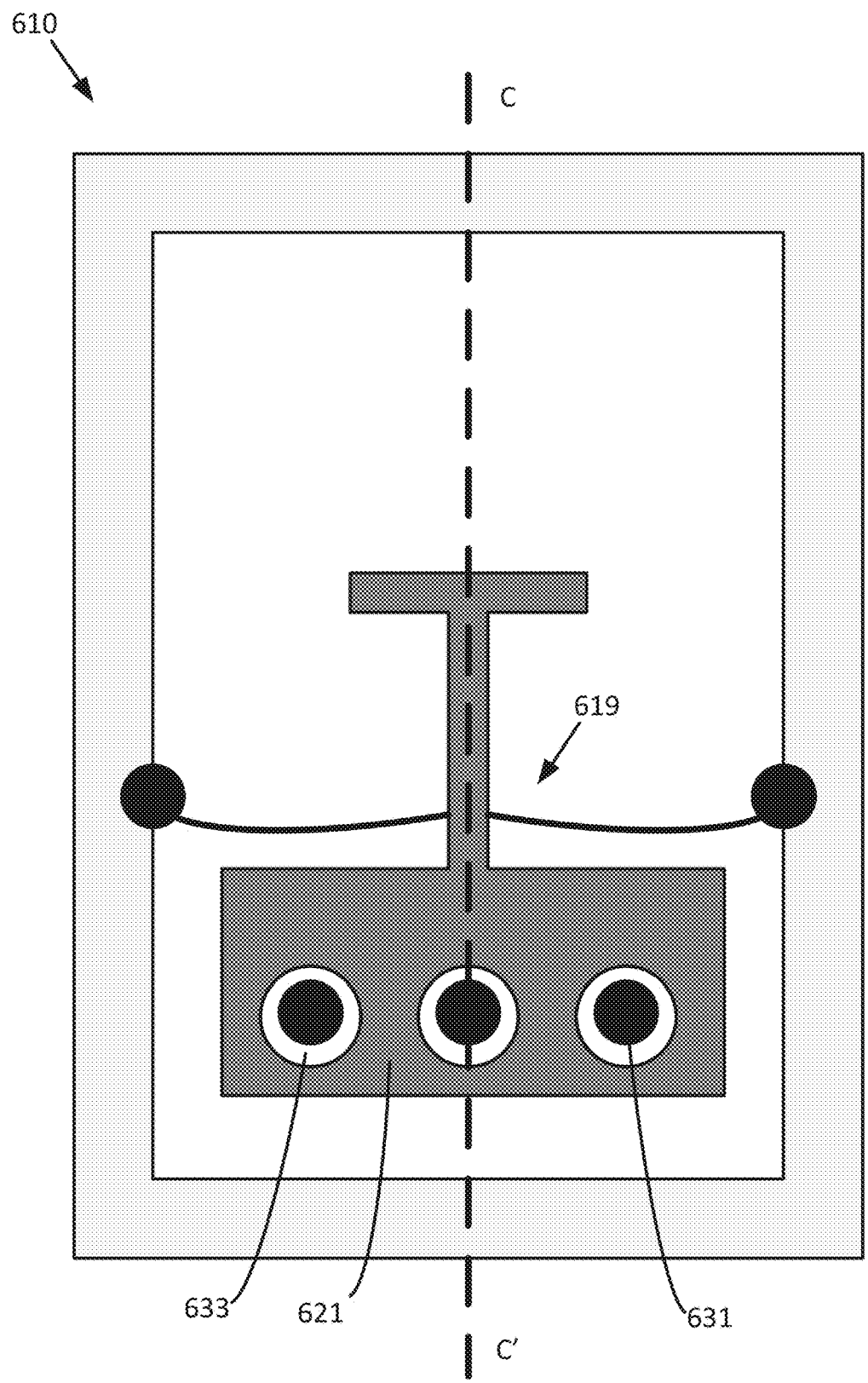
FIG. 7 depicts the package substrate of FIG. 6 with the bistable switch in an "open" configuration, in accordance with various embodiments.
Figure 8:
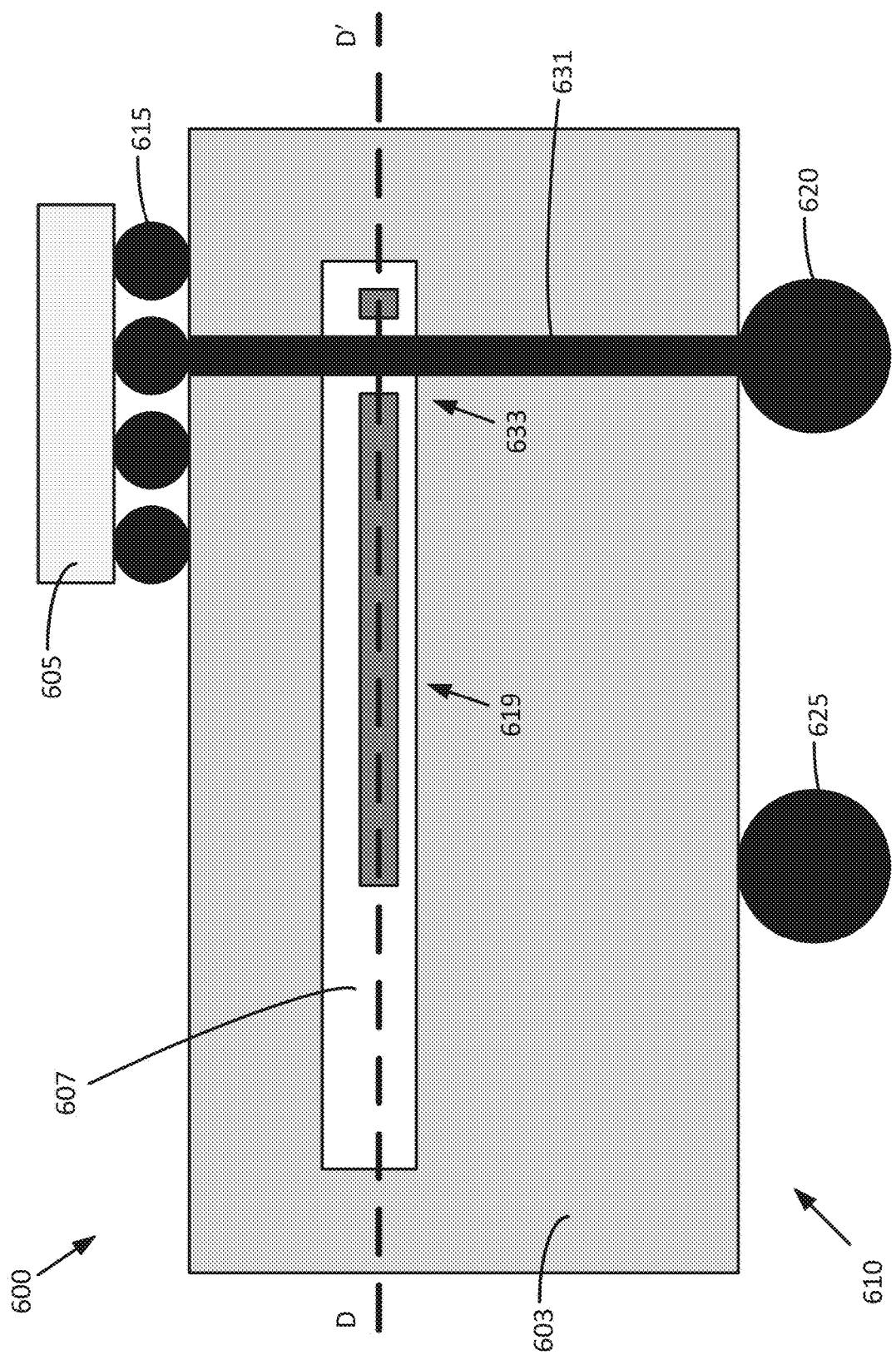
FIG. 8 depicts a simplified cross-sectional view of the package substrate of FIG. 6, in accordance with various embodiments.

FIGS. 6-8 depict an example package substrate 610 which may include a bistable switch 619 that may provide ESD mitigation. Specifically, FIG. 6 depicts a simplified top-down view of a package substrate 610 with an ESD protection structure that includes a bistable switch 619 in a "closed" configuration, in accordance with various embodiments. FIG. 7 depicts the package substrate 610 with the bistable switch 619 in an "open" configuration, in accordance with various embodiments. FIG. 8 depicts a simplified cross-sectional view of the package substrate 610, in accordance with various embodiments. Generally, FIG. 8 is a simplified cross-sectional view along line C-C' of FIG. 7. FIGS. 6 and 7 are simplified top-down views of the switch (with FIG. 7 being a top-down view along line D-D' of FIG. 8). In FIG. 8, a larger view of the overall microelectronic package 600 is depicted, which may include a die 605 and an interconnect 615 which may be respectively similar to, and share one or more characteristics with, die 305 and interconnect 315.

The package substrate 610 may include a substrate material 603, a cavity 607, one or more ground vias 623, one or more ground couples 627, and one or more signal vias 631 which may be respectively similar to, and share one or more characteristics with, substrate material 303, cavity 307, ground via(s) 323, ground couple(s) 327, and signal via(s) 331. Further, the microelectronic package 600 may include interconnects 620 and 625 which may be respectively similar to, and share one or more characteristics with, interconnects 320 and 325. It will be understood that the package substrate 610 may further include one or more actuators, which may be similar to, and share one or more characteristics with, actuators 311. However, the actuators are not depicted in FIGS. 6-8 for the sake of clarity of the Figure. Similar to the package substrate 310, it will be understood that although element 631 is described herein as a "via," in some embodiments element 631 may be a pad or some other element that is coupled with a via that traverses between layers of the package substrate 610.

The package substrate 610 may further include a switch 619 which may be similar to, and share one or more characteristics with, switch 319. Specifically, the switch 619 may include an actuator plate 671 and a connecting element 673, which may be respectively similar to, and share one or more characteristics with, actuator plate 371 and connecting element 373. The switch 619 may further include a strike plate 621 as may be seen in FIGS. 6 and 7. Generally, the strike plate 621 may be similar to, and share one or more characteristics with, strike plate 321 of package substrate 310. Specifically, the strike plate 621 may be formed of a conductive material that is communicatively coupled with the connecting element 673. In this way, the strike plate 621 may be communicatively coupled to ground by way of a communicative coupling to ground vias 623 through the ground couple 627. In this embodiment, rather than contacting signal traces, the strike plate 621 may include one or more through holes 633 that generally surround the signal vias 631. The through holes 633 may have a diameter that is greater than that of the signal vias 631. When the switch 619 is in the closed position as shown in FIG. 6, the strike plate 621 may communicatively couple with the signal vias 631, thereby shunting the signal vias 631 to ground. When the switch 619 is in the open position as shown in FIG. 7, the strike plate 621 may be communicatively decoupled from the signal vias 631, allowing for data signals to traverse between the interconnect 620 and the die 605.

Similarly to the embodiments of FIGS. 3-5, it will be understood that the embodiment of FIGS. 6-8 is intended as an example embodiment and other embodiments may vary. For example, the microelectronic package may include more or fewer elements than are depicted. Specifically, additional active or inactive elements such as capacitors, resistors, etc. may be present in various of the signal or ground paths, within the cavity 607, etc. In some embodiments, more or fewer dies, interconnects, signal traces, signal vias, switches, etc. may be present. In some embodiments, the relative dimensions of various elements along one or more axes may be different than depicted. In some embodiments the specific shapes of various elements such as the actuators, the switches, the various vias or traces, etc. may be different in other embodiments. Other variations may be present in other embodiments.

Figure 9:
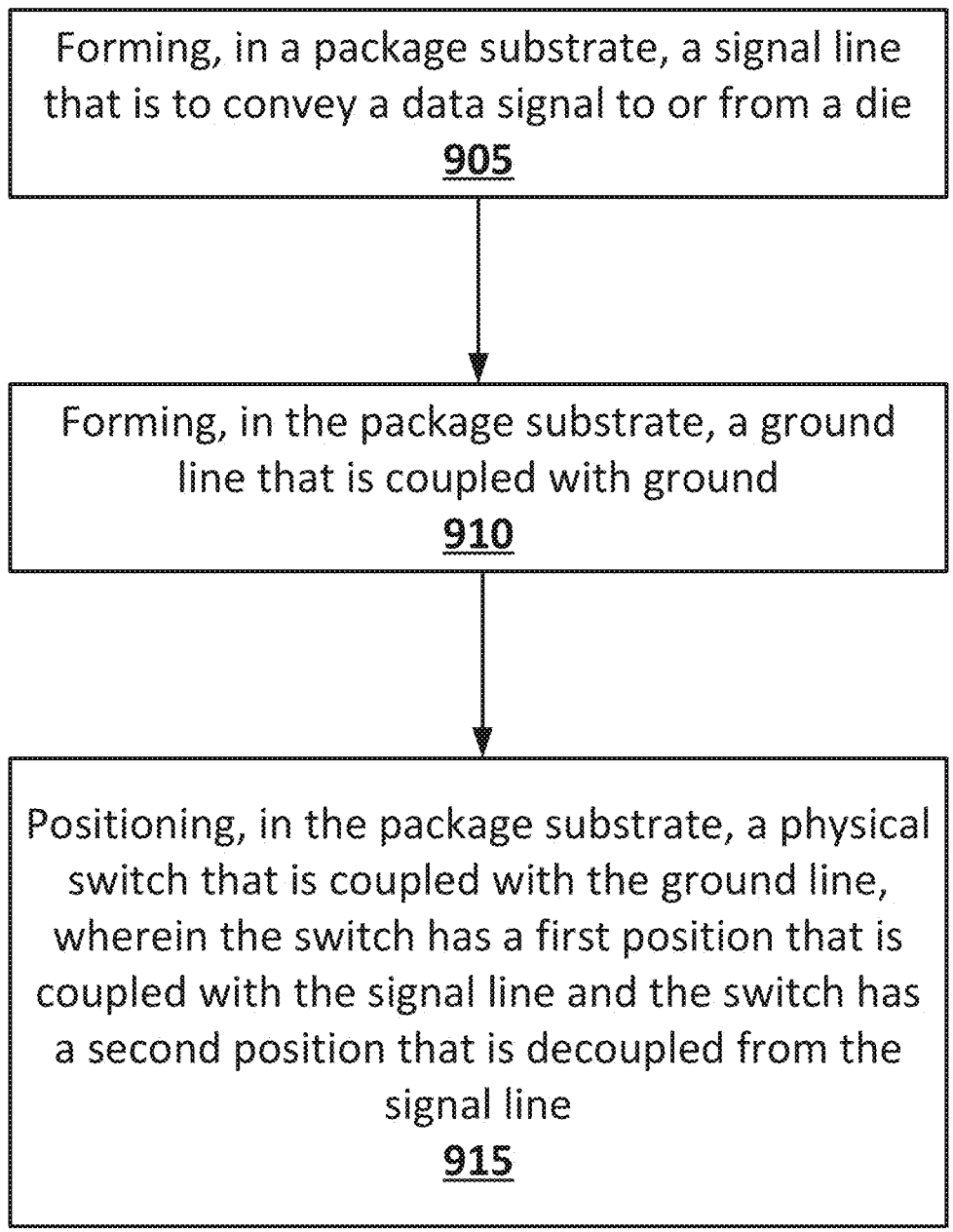
FIG. 9 depicts an example technique by which a package substrate with a bistable switch may be manufactured, in accordance with various embodiments.

FIG. 9 depicts an example technique by which a package substrate such as package substrates 310 or 610 may be formed. Generally, the technique will be described with respect to elements of package substrate 310, however it will be understood that the technique may, in whole or in part, with or without modification, be equally applicable to other embodiments of the present disclosure.

The technique may include forming, at 905, in a package substrate, a signal line that is to convey a data signal to or from a die. The package substrate may be similar to package substrate 310. The die may be similar to die 305. The signal line may be similar to, for example, signal via 331. Formation of the signal line may be accomplished through deposition, plating, or some other technique.

The technique may further include forming, at 910, in the package substrate, a ground line that is coupled with ground. The ground line may be, for example, ground vias 323. Formation of the ground vias may be accomplished in a manner similar to that described above with respect to the signal line. Specifically, formation of the ground vias may be accomplished through deposition, plating, etc.

The technique may further include positioning, at 915, in the package substrate, a physical switch that is coupled with the ground line. The switch may be, for example, switch 319. The switch may have a first position that is coupled with the signal line. The first position may be, for example, the closed position as depicted in FIG. 3. The switch may also have a second position that is decoupled from the signal line. The second position may be, for example, the open position as depicted in FIG. 4. Positioning of the switch may be accomplished through forming the switch using a technique such as deposition (e.g., by way of plating or some other technique) of the switch and actuator elements, and the formation of a cavity (e.g., by way of etching or some other technique) to allow the switch to move between one position and another upon actuation. In other embodiments, positioning of the switch may include a pick-and-place operation or some other operation where a pre-formed switch (which may include the entire switch, a portion thereof, additional elements such as actuator elements, etc.) may be placed in a cavity in the package substrate.

It will be understood that the example technique of FIG. 9 is intended as one example, and other embodiments may vary. For example, the specific formation techniques described above may vary in other embodiments. Also, certain elements may be performed in an order different than that depicted in FIG. 9. As one example, element 910 may be performed prior to, or concurrently with, element 905. Other variations may be present.

Figure 10:
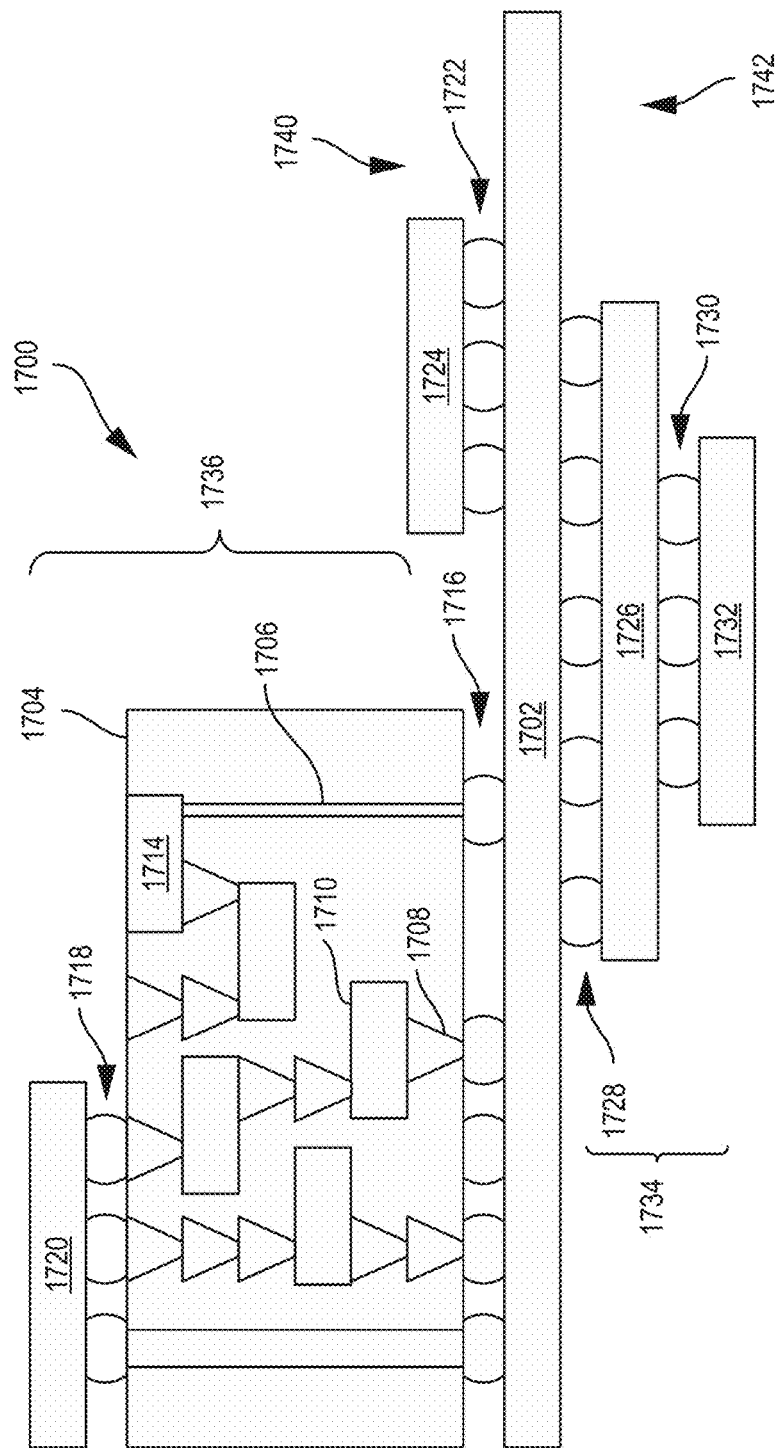
FIG. 10 is a side, cross-sectional view of an IC device assembly that may include an ESD protection structure with a bistable switch, in accordance with various embodiments.

FIG. 10 is a side, cross-sectional view of an IC device assembly 1700 that may include one or more IC packages or other electronic components (e.g., a die) including one or more package substrates with a bistable switch positioned therein, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to a package interposer 1704 (which may be similar to a package substrate such as package substrate 310 or some other package substrate) by coupling components 1718. The coupling components 1718 may take any suitable form for the application, such as the forms discussed above with reference to the coupling components 1716. Although a single IC package 1720 is shown in FIG. 10, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die, an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 10, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more ESD protection structures that include a bistable switch as described above.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
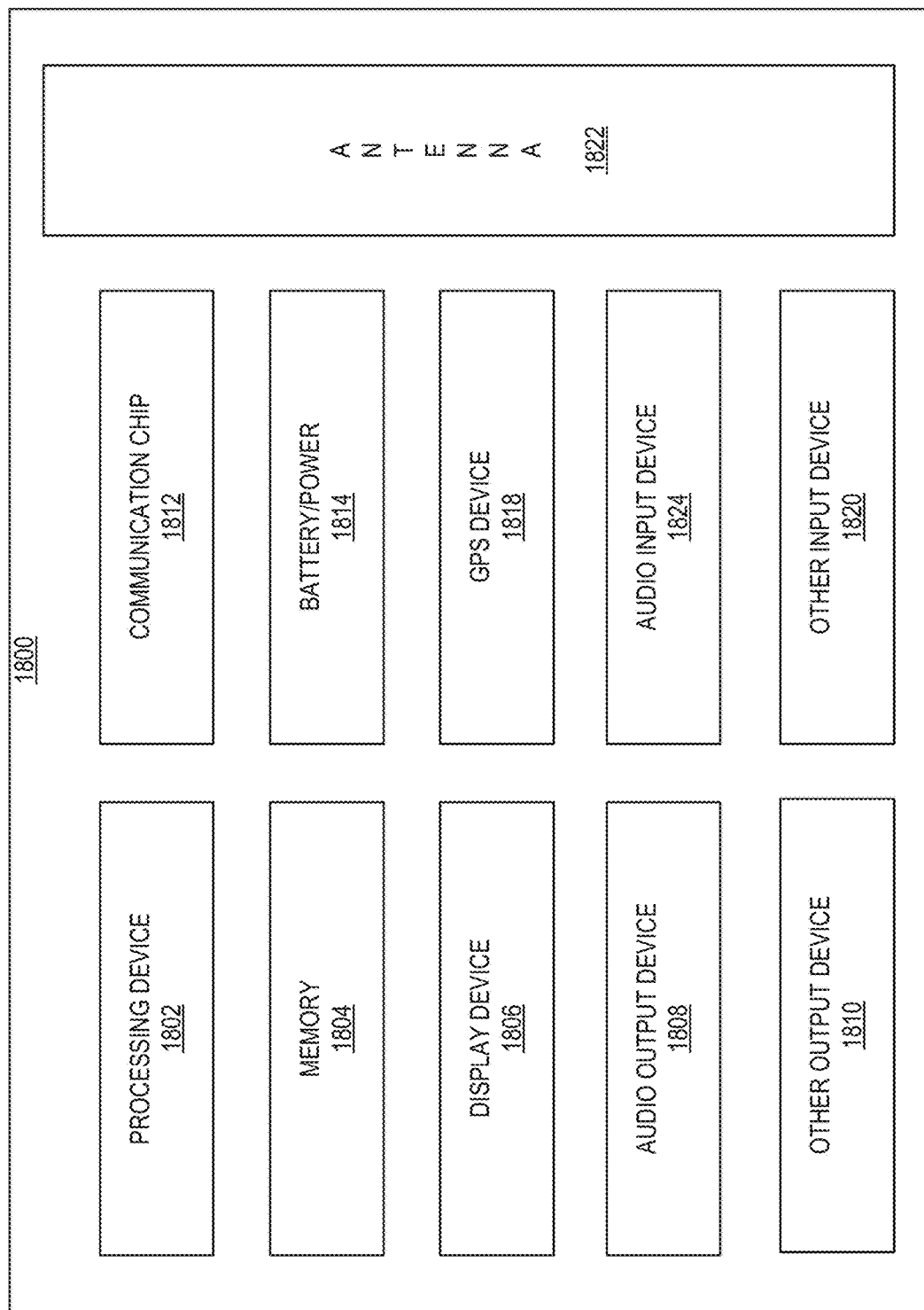
FIG. 11 is a block diagram of an example electrical device that may include an ESD protection structure with a bistable switch, in accordance with various embodiments.

FIG. 11 is a block diagram of an example electrical device 1800 that may include one or more ESD protection structures with a bistable switch, in accordance with any of the embodiments disclosed herein. For example, any suitable ones of the components of the electrical device 1800 may include one or more of the IC device assemblies 1700, IC packages, IC devices, or dies disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), CPUs, graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a package substrate for use in a microelectronic package, wherein the package substrate comprises: a signal line to carry a data signal to a die of the microelectronic package; a ground line coupled to a ground of the microelectronic package; and a switch that is communicatively coupled with the ground line, wherein the switch has a first position such that the switch is also communicatively coupled with the signal line, and the switch has a second position such that the switch is communicatively separated from the signal line.

Example 2 includes the package substrate of example 1, wherein the switch is an element of a layer of the package substrate.

Example 3 includes the package substrate of example 2, wherein the switch is in a cavity of the layer of the package substrate.

Example 4 includes the package substrate of example 1, wherein the package substrate includes an actuator that is to move the switch between the first position and the second position.

Example 5 includes the package substrate of example 4, wherein the actuator is an electrothermal actuator.

Example 6 includes the package substrate of any of examples 1-5, wherein the switch includes a plate that is to couple with the signal line when the switch is in the first position.

Example 7 includes the package substrate of any of examples 1-5, wherein the switch includes a plate that surrounds the signal line.

Example 8 includes a microelectronic package comprising: a die; and a package substrate coupled with the die, wherein the package substrate includes: a signal line to carry a data signal between the die and an interconnect of the package substrate; a ground line that is coupled with ground; and a switch that is coupled with the ground line, wherein the switch is operable to selectively couple with the signal line at a first position or decouple from the signal line at a second position.

Example 9 includes the microelectronic package of example 8, wherein the signal line is a signal line of a plurality of signal lines, and the switch is further operable to selectively couple with the plurality of signal lines at the first position.

Example 10 includes the microelectronic package of examples 8 or 9, wherein the signal line is a trace.

Example 11 includes the microelectronic package of example 10, wherein the switch includes a plate that is to couple with the trace when the switch is in the first position.

Example 12 includes the microelectronic package of examples 8 or 9, wherein the signal line is a via.

Example 13 includes the microelectronic package of example 12, wherein the switch includes a plate that surrounds the via.

Example 14 includes a method of forming a package substrate for use in a microelectronic package, wherein the method comprises: forming, in a package substrate, a signal line that is to convey a data signal to or from a die; forming, in a package substrate, a ground line that is coupled with ground; and positioning, in the package substrate, a physical switch that is coupled with the ground line, wherein the switch has a first position that is coupled with the signal line and the switch has a second position that is decoupled from the signal line.

Example 15 includes the method of example 14, wherein forming the physical switch includes forming a cavity in a layer of the package substrate and positioning the switch within the cavity.

Example 16 includes the method of example 14, further comprising positioning the physical switch in a layer of the package substrate.

Example 17 includes the method of example 16, wherein the layer is a same layer in which the signal line is positioned.

Example 18 includes the method of any of examples 14-17, wherein positioning the switch includes forming the switch around the signal line.

Example 19 includes the method of any of examples 14-17, further comprising coupling an actuator to the switch, wherein the actuator is to move the switch between the first position and the second position.

Example 20 includes the method of example 19, wherein the actuator is an electrothermal or electromechanical actuator.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A package substrate for use in a microelectronic package, wherein the package substrate comprises:
a signal line to carry a data signal to a die of the microelectronic package;
a ground line coupled to a ground of the microelectronic package; and
a switch that is communicatively coupled with the ground line, wherein:
the switch has a first position such that the switch is also communicatively coupled with the signal line,
the switch has a second position such that the switch is communicatively separated from the signal line, and
the switch is in a cavity of a layer of the package substrate.

2. The package substrate of claim 1, wherein the switch is an element of the layer of the package substrate.

3. The package substrate of claim 1, wherein the package substrate includes an actuator that is to move the switch between the first position and the second position.

4. The package substrate of claim 3, wherein the actuator is an electrothermal actuator.

5. The package substrate of claim 1, wherein the switch includes a plate that is to couple with the signal line when the switch is in the first position.

6. The package substrate of claim 1, wherein the switch includes a plate that surrounds the signal line.

7. A microelectronic package comprising:
a die; and a package substrate coupled with the die, wherein the package substrate includes:
    a signal line to carry a data signal between the die and an interconnect of the package substrate;
    a ground line that is coupled with ground; and
    a switch that is coupled with the ground line, wherein:
        the switch is operable to selectively couple with the signal line at a first position or decouple from the signal line at a second position, and
        the switch is in a cavity of a layer of the package substrate.

8. The microelectronic package of claim 7, wherein the signal line is a signal line of a plurality of signal lines, and the switch is further operable to selectively couple with the plurality of signal lines at the first position.

9. The microelectronic package of claim 7, wherein the signal line is a trace.

10. The microelectronic package of claim 9, wherein the switch includes a plate that is to couple with the trace when the switch is in the first position.

11. The microelectronic package of claim 7, wherein the signal line is a via.

12. The microelectronic package of claim 11, wherein the switch includes a plate that surrounds the via.

13. A method of forming a package substrate for use in a microelectronic package, wherein the method comprises:
    forming, in a package substrate, a signal line that is to convey a data signal to or from a die;
    forming, in a package substrate, a ground line that is coupled with ground; and
    positioning, in a cavity in a layer of the package substrate, a physical switch that is coupled with the ground line, wherein the physical switch has a first position that is coupled with the signal line and the physical switch has a second position that is decoupled from the signal line.

14. The method of claim 13, further comprising forming the cavity in the layer of the package substrate.

15. The method of claim 13, further comprising positioning the physical switch in the layer of the package substrate.

16. The method of claim 15, wherein the layer is a same layer in which the signal line is positioned.

17. The method of claim 13, wherein positioning the physical switch includes forming the switch around the signal line.

18. The method of claim 13, further comprising coupling an actuator to the physical switch, wherein the actuator is to move the switch between the first position and the second position.

19. The method of claim 18, wherein the actuator is an electrothermal or electromechanical actuator.

* * * * *